(12) United States Patent
Pelz et al.

(10) Patent No.: US 7,023,220 B2
(45) Date of Patent: Apr. 4, 2006

(54) METHOD FOR MEASURING NM-SCALE TIP-SAMPLE CAPACITANCE

(75) Inventors: Jonathan P. Pelz, Columbus, OH (US); David T. Lee, Dublin, OH (US); Bharat Bhushan, Powell, OH (US)

(73) Assignee: The Ohio State University, Columbus, OH (US)

( * ) Notice: Subject to any disclaimer, the term of this patent is extended or adjusted under 35 U.S.C. 154(b) by 0 days.

(21) Appl. No.: 10/967,930

(22) Filed: Oct. 19, 2004

(65) Prior Publication Data

US 2005/0077915 A1    Apr. 14, 2005

Related U.S. Application Data

(62) Division of application No. 10/313,431, filed on Dec. 6, 2002, now Pat. No. 6,856,145.
(60) Provisional application No. 60/386,010, filed on Jun. 4, 2002.

(51) Int. Cl.
*G01R 27/26* (2006.01)
(52) U.S. Cl. .................. 324/658; 324/684; 324/690
(58) Field of Classification Search ........ 324/658–663, 324/683, 686, 762; 250/306, 307; 73/105
See application file for complete search history.

(56) References Cited

U.S. PATENT DOCUMENTS

| 5,440,121 | A | 8/1995 | Yasutake et al. ............ 250/306 |
|---|---|---|---|
| 5,742,172 | A | 4/1998 | Yasutake .................... 324/754 |
| 5,874,734 | A * | 2/1999 | Elings et al. ................ 250/306 |
| 5,886,532 | A | 3/1999 | Hsu et al. .................... 324/635 |
| 6,038,916 | A | 3/2000 | Cleveland et al. ............ 73/105 |
| 6,211,686 | B1 | 4/2001 | Matsuzawa et al. ........ 324/719 |
| 6,404,207 | B1 | 6/2002 | Bhushan .................... 324/671 |
| 6,492,827 | B1 | 12/2002 | Mazur et al. ............... 324/761 |

OTHER PUBLICATIONS

University of Manitoba, *Scanning Capacitance Microscopy*, Jun. 16, 1999.
University of Manitoba, *Scanning Probe Microscopy Laboratory*, Jul. 8, 1999.
Veeco Metrology Group, *Scanning Capacitance Microscopy*, copyright 2001.
Veeco Metrology Group, *Scanning Capacitance Microscopy for Carrier Profiling in Semiconductors*, copyright 2001.

* cited by examiner

*Primary Examiner*—Vincent Q. Nguyen
(74) *Attorney, Agent, or Firm*—Standley Law Group LLP

(57) ABSTRACT

A method for measuring nm-scale tip-sample capacitance including (a) measuring a cantilever deflection and a change in probe-sample capacitance relative to a reference level as a function of a probe assembly height; (b) fitting out-of-contact data to a function; (c) subtracting the function from capacitance data to get a residual capacitance as a function of the probe assembly height; and (d) determining the residual capacitance at a z-position where the cantilever deflection is zero.

4 Claims, 9 Drawing Sheets

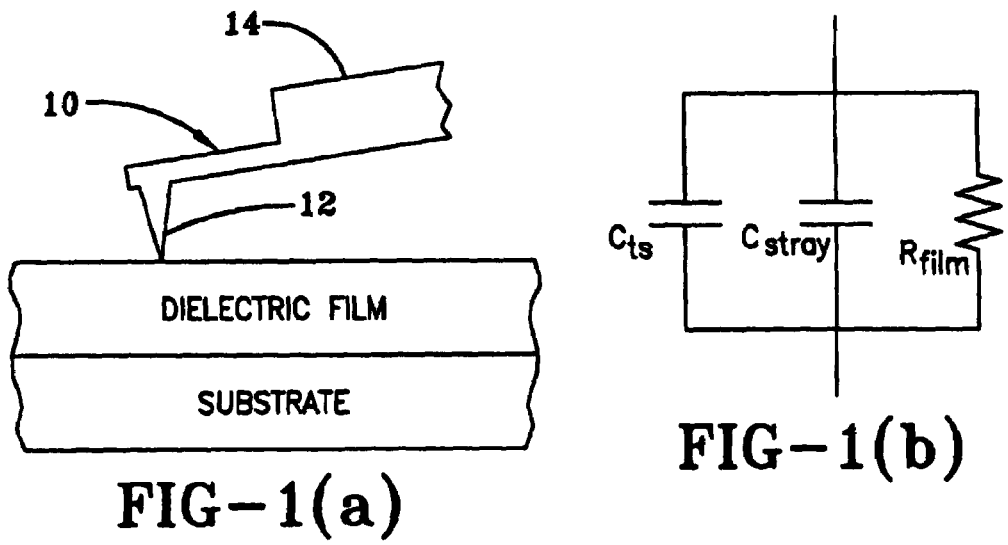
FIG-1(a)
FIG-1(b)
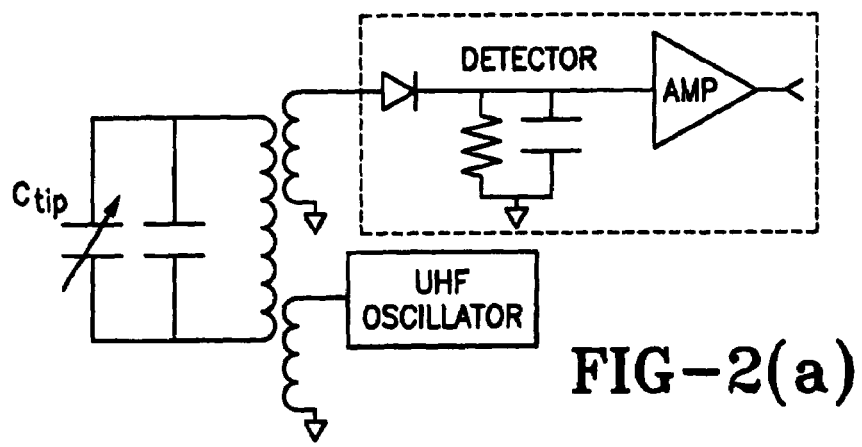
FIG-2(a)
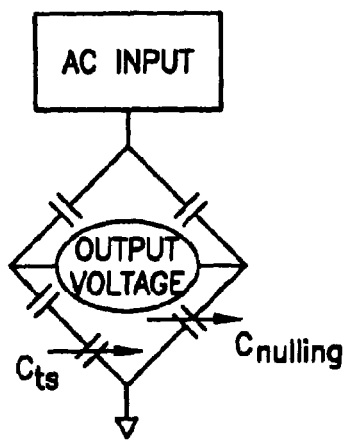
FIG-2(b)

EXTENSION, APPROACH SURFACE

ADHESIVE CONTACT

REPULSIVE CONTACT

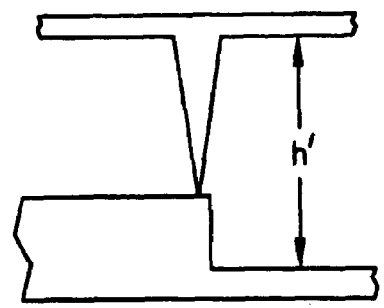
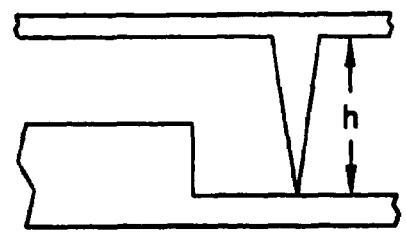
FIG-10(a)   FIG-10(b)
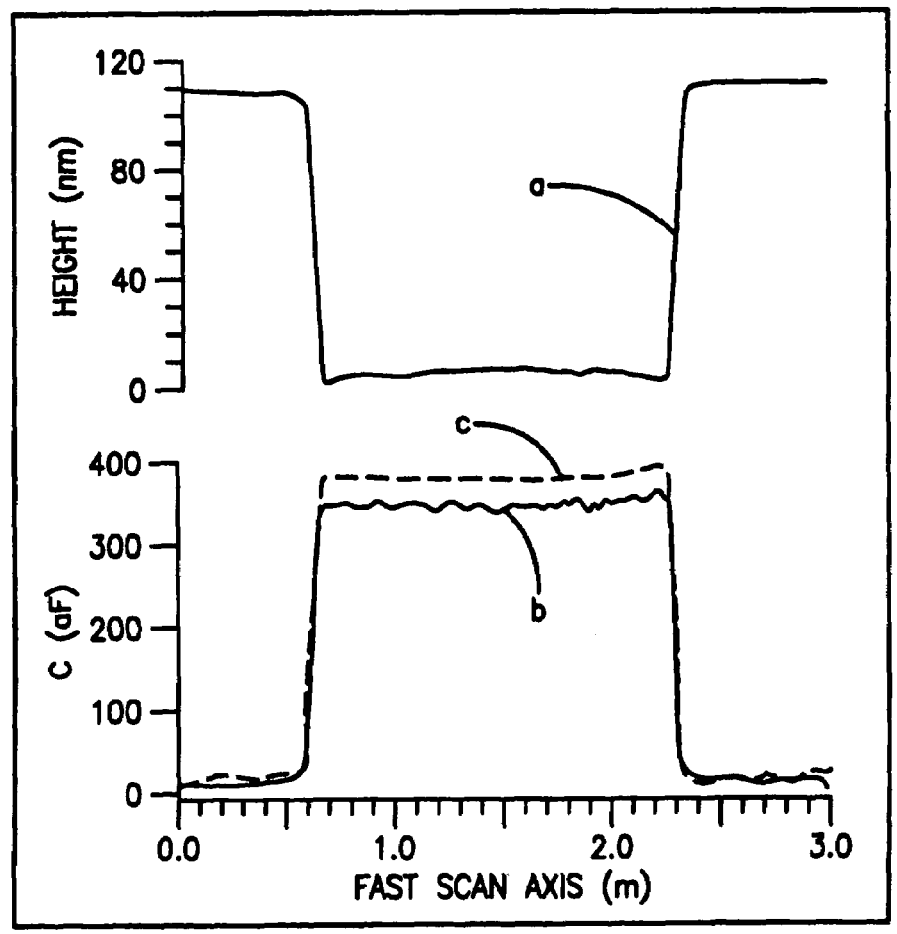
FIG-11

METHOD FOR MEASURING NM-SCALE TIP-SAMPLE CAPACITANCE

This application is a divisional application of U.S. patent application Ser. No. 10/313,431, filed Dec. 6, 2002, now U.S. Pat. No. 6,856,145, which claims the benefit of U.S. Provisional Application No. 60/386,010, filed Jun. 4, 2002, the substance of each is hereby incorporated by reference in their entirety.

The present invention was made with United States Government support under contract nos. CMS-0001382 and DMR 0074416. The United States Government may have certain rights to this invention under 35 U.S.C. §200 et seq.

BACKGROUND OF THE INVENTION

The present invention relates generally to a system and method for measuring capacitance. More particularly, the present invention relates to a system and method for measuring capacitance between a probe and a semiconductor sample.

The present invention may be useful in the field of scanning capacitance microscopy (SCM). In a typical embodiment of SCM, a nanometer scale-conducting tip is scanned across a sample surface, and a capacitance detector measures variations in the probe-sample capacitance C. To date, some of the most common applications of SCM have been semiconductor characterization including dopant profiling, device characterization, and surface defect characterization. A common thread in these measurements is that the samples exhibit voltage dependent capacitance due to a voltage-dependent space charge layer in the semiconductor substrate. These implementations of SCM generally do not measure C directly. Rather, they typically measure dC/dV by varying the probe-sample voltage V at frequencies greater than 10 kHz. In other words, existing SCM circuits are typically not adapted for calibrated low frequency measurements of absolute capacitance.

However, not all systems of interest contain a semiconductor space-charge layer that exhibits voltage dependent capacitance. This is particularly true for thin dielectric films on highly conducting (metallic) substrates. In this case, it is necessary to measure the capacitance directly rather than measuring dC/dV. Examples of such thin-film systems include perfluoropolyether compounds that are of fundamental importance in the lubrication of diskdrive and microelectromechanical machine systems (MEMS). Previously, a macroscopic form of "direct" SCM has been used to used to monitor thin, perfluoropolyether lubricant films with mm-scale lateral resolution by applying an AC voltage and measuring the resulting displacement current.

Despite the many benefits of known embodiments of SCM, there are still many needs in the field of capacitance measurement. For instance, a need exists for a SCM technique that can achieve a lateral resolution of <500 nm. A need also exists for a system and method for calibrated low frequency measurements of absolute capacitance of a probe-sample junction. Also, a need exists for determining the stray capacitance of a probe-sample junction. A further need exists for factoring out the stray capacitance of a probe-sample junction when measuring the tip-sample capacitance.

SUMMARY OF THE INVENTION

The present invention includes a system and method for measuring capacitance between a probe and a semiconductor sample. The present invention may be particularly useful in the field of SCM and other similar or related fields. In addition, based on the teaching of the present specification, those skilled in the art will readily recognize that the present invention may be useful in other fields in which it is desired to measure capacitance.

In one embodiment of the present invention, a system for measuring capacitance includes a power supply that is adapted to provide an AC voltage. A sample is in electrical communication with the power supply. The sample comprises a dielectric layer and a substrate layer. A probe is substantially adjacent to the dielectric layer of the sample. A phase shifter is also in electrical communication the power supply. In one exemplary embodiment, the phase shifter is adapted to produce an output which is substantially 180 degrees out of phase with respect to the AC voltage. A coupling capacitor is adapted to receive an output of the phase shifter. A current amplifier is adapted to receive a net current from the probe and the coupling capacitor. A lock-in amplifier is in electrical communication with the current amplifier, and it is adapted to determine a displacement component and a dissipative component of the net current, which are substantially 90 degrees out of phase with each other.

The present invention may be useful for measuring a wide variety of dielectric films. In one exemplary embodiment, the sample may comprise $SiO_2$ grown on Si. Other examples include thin dielectric films on semiconductor substrates including, but not limited to, $Si_3N_4$, $Al_2O_3$, TiO, $ZrO_2$, and other similar or suitable substrates. Examples of suitable samples also include thin lubricant films on either semiconductor or conducting films. For instance, perfluoropolyethers are a widely used class of compounds for MEMS and hard disk drive lubrication where a thickness measurement technique of the present invention may be useful. In addition, other suitable types of samples include self-assembled monolayers on a variety of semiconducting, conducting, or thin insulating layers on conducting substrates.

Practically any drive frequency may be used when practicing this invention. In one embodiment, the power supply may be adapted to provide a low frequency AC voltage. For instance, the power supply may be adapted to provide a sinusoidal voltage having a frequency of between about 3 kHz and about 7 kHz. However, it should be recognized that the drive frequency may be less than 3 kHz or greater than 7 kHz. For instance, the drive frequency may be about 1 MHz. Certain embodiments of the present invention may perform better at higher drive frequencies. In particular, a higher drive frequency may result in a larger displacement current which is easier to measure.

In one exemplary embodiment, the probe may be a component of an Atomic Force Microscope (AFM). The probe may include a cantilever, a tip, and a cantilever chip. The tip may extend from the cantilever to be substantially adjacent to the dielectric layer of the sample, and the cantilever chip is secured to the cantilever. In certain embodiments of the present invention, the probe may be adapted to scan the sample.

The capacitance between the sample and the probe may include a capacitance $C_{stray}$ through which a displacement current is adapted to flow. In such an embodiment, a bucking current may be driven through the capacitance $C_{cc}$ such that the displacement current through the capacitance $C_{stray}$ is substantially negated.

The system may also include a gain amplifier which may be interposed between the power supply and the phase shifter. As previously noted, the capacitance between the sample and the probe may include a capacitance $C_{stray}$, and the coupling capacitor has a capacitance $C_{cc}$. In such an embodiment, the gain of the gain amplifier may be about equal to $C_{stray}/C_{cc}$.

The present invention also includes a method for measuring capacitance. The method may include any steps that are adapted to be performed by the aforementioned system of the present invention. In one exemplary embodiment, the method comprises the following steps. A sample is provided that comprises a dielectric layer and a substrate layer. A probe is positioned substantially adjacent to the dielectric layer of the sample, and an AC voltage is supplied to the sample such that a probe-sample current flows through a probe-sample junction. The AC voltage is shifted to produce a bucking voltage that drives a bucking current through a capacitance $C_{cc}$. For example, the shifting step may cause the bucking current to be substantially 180 degrees out of phase with respect to the AC voltage. The probe-sample current and the bucking current are then added to produce a net current. Thereafter, a displacement component of the net current are determined. A capacitance change is then determined from the displacement component of the net current.

The probe-sample current may include a displacement current that flows through a capacitance $C_{stray}$ between the sample and the probe. In such an embodiment, the step of adding the probe-sample current and the bucking current may result in the bucking current substantially negating the displacement current that flows through the capacitance $C_{stray}$. A purpose of negating the displacement current that flows through $C_{stray}$ is to allow the current amplifier to be operated at a high gain/low noise setting without overloading.

The method may also include the step of scanning the probe across the sample while the AC voltage is supplied to the sample. In addition, the method may further comprise the step of adjusting a gain of the bucking current. For instance, the gain of the bucking current may be adjusted to be about equal to $C_{stray}/C_{cc}$, where $C_{stray}$ is a capacitance that exists between the sample and the probe. Furthermore, another exemplary embodiment of the present invention may include the steps of determining a dissipative component of the net current and a dissipation variation between the probe and the sample.

The present invention also includes a method for analyzing measured capacitance data by subtracting any changes in capacitance that are due to changes in long-range stray capacitance that occur when the probe assembly is scanned. This method may include any of the optional or preferred features of the other embodiments of the present invention. In this method, a sample is provided that comprises a dielectric layer and a substrate layer. A tip of a probe is positioned substantially adjacent to the dielectric layer of the sample. While the tip is scanned across the sample, an AC voltage is supplied to the sample. Capacitance data is then determined as a function of probe height relative to the sample and as a function of lateral probe position. Thereafter, capacitance changes are taken into account that are due to the lateral position and height of the probe relative to the sample.

In one exemplary embodiment, the step of accounting for capacitance changes may include the following steps: determining a slope of a capacitance v. probe height curve as the tip approaches the sample; determining topography data of the sample; flattening the topography data; determining a capacitance change (e.g., a change in long-range stray capacitance) using the slope and the topography data; subtracting the capacitance change from the capacitance data to obtain corrected data; and flattening the corrected data.

Another embodiment of the present invention is a method to measure the "absolute" magnitude of nm-scale capacitance at a point of the sample. An exemplary embodiment of this method may include the following steps: measuring a cantilever deflection and a change in probe-sample capacitance relative to a reference level as a function of a probe assembly height; fitting out-of-contact data to a function; subtracting the function from capacitance data to get a residual capacitance as a function of the probe assembly height; and determining the residual capacitance at a z-position where the cantilever deflection is zero.

The present invention may provide some or all of the following benefits. One embodiment of the present invention can be implemented as instrumentation for SCM. The instrumentation, which may include an Atomic Force Microscope (AFM), may be designed to make calibrated, low frequency measurements of tip-sample capacitance and spreading resistance of thin dielectric films. Certain embodiments of the present invention may include the characterization of spatial variations in a stray capacitance $C_{stray}$ such that tip-sample measurements may be further interpreted. An exemplary circuit of the present invention may use a commercially available current amplifier and low frequency (e.g., approximately 5 kHz) lock-in detection. The circuit may add an inverted, constant amplitude current to suppress the stray displacement current from the large (e.g., approximately 0.5 pF) stray capacitance $C_{stray}$ between the sample and, for example, a mm-sized cantilever-probe assembly. In one embodiment, the capacitance noise spectrum may be about 0.35 aF/$\sqrt{Hz}$ and may be flat down to 1 Hz measurement frequency, with an integrated noise less than about 5 aF integrated over a 1 to 160 Hz bandwidth.

An exemplary embodiment of the instrumentation may be used to identify and characterize significant (e.g., greater than about 10 aF) variations in $C_{stray}$ to facilitate accurate measurement of aF-level variations in the nm-scale tip-sample capacitance. In fact, the inventors have surprisingly discovered that $C_{stray}$ varies with lateral probe position. This is due to tilting of the probe assembly as the piezo-electric scanner tube bends during scanning. The inventors have also surprisingly found that $C_{stray}$ varies significantly with probe-assembly height. This causes topography related artifacts in capacitance images of rough surfaces. Nevertheless, in certain embodiments of the present invention, stray capacitance artifacts can be mostly eliminated by properly characterizing position and height dependent variations in $C_{stray}$ and subtracting them from measured capacitance data.

In addition to the novel features and advantages mentioned above, other features and advantages of the present invention will be readily apparent from the following descriptions of the drawings and exemplary embodiments.

BRIEF DESCRIPTION OF THE DRAWINGS

FIG. 1(a) is a schematic of an exemplary probe assembly-sample region.

FIG. 1(b) is an equivalent electric circuit of the region of FIG. 1(a) that includes nm-scale tip-sample capacitance $C_{ts}$, in parallel with the stray capacitance $C_{stray}$, and film resistance $R_{film}$. In an exemplary embodiment, $C_{stray}$ is typically about ½ pF while $C_{ts}$ is typically about 1–300 aF, depending on tip radius and on the thickness and composition of the material or materials between the conducting tip and conducting substrate.

FIG. 2(a) is a schematic of a typical RCA type tuned circuit used in commercial SCMs. A UHF signal is inductively coupled to a tuned circuit that includes the AFM tip-sample capacitance. The tuned circuit is inductively coupled to a diode demodulator detector circuit.

FIG. 2(b) is a schematic of a bridge circuit for detecting small changes in capacitance against a large background capacitance. The nulling capacitor is varied until there is no output voltage. Variations in $C_{ts}$ then unbalance the bridge and create an output voltage. A lock-in amplifier is typically used to amplify the signal and reject the noise.

FIG. 10 is a schematic view of an exemplary cantilever and tip during a 90° scan across a step. The average separation, h, between the sample and the entire probe assembly decreases abruptly when the tip is scanned from the upper side (a) to the lower side (b) of a step.

FIG. 11 includes graphs of line traces of (a) surface height and (b) ΔC during a 90° scan across a 104 nm deep trench etched through an exemplary sample of $SiO_2$ on Si and covered with 10 nm $Si_3N_4$. The height scan was flattened to remove an average slope. The ΔC scan was flattened to remove the lateral position dependent slope in $C_{stray}$. Dashed line (c) was calculated by multiplying surface height line (a) by −3.6 aF/nm, the slope of the measured ΔC versus z data.

DETAILED DESCRIPTION OF EXEMPLARY EMBODIMENT(S)

Figure 3:
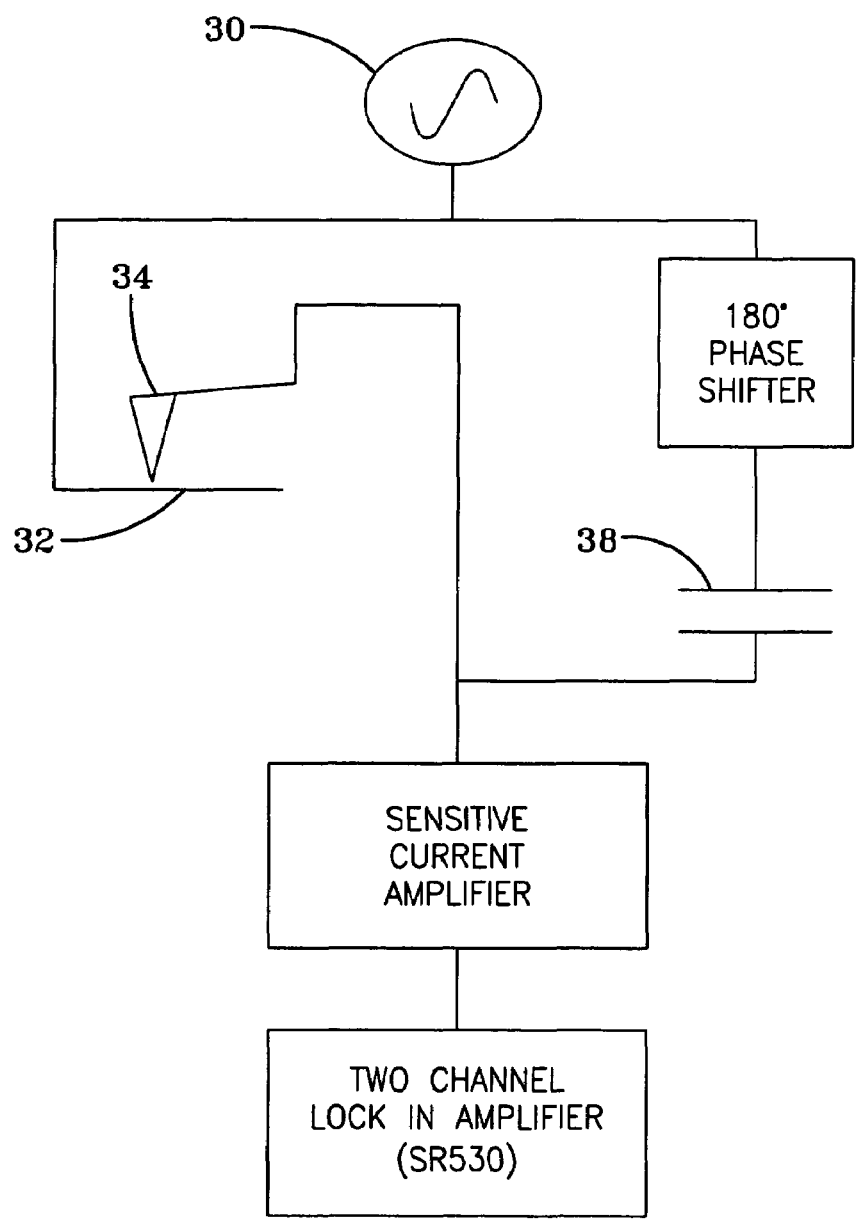
FIG. 3 is a schematic of an exemplary embodiment of circuitry of the present invention used to measure capacitance. The left side includes the probe-sample region while the right side includes the "bucking circuit" described in the detailed description.

The present invention is directed to a system and method for measuring capacitance. The present invention may be useful for SCM and any other field in which it is desired to measure capacitance. In one exemplary embodiment of the present invention, a system comprised of commercially available electronics is provided that can measure the capacitance with sub-aF/√Hz noise levels at frequencies down to 1 Hz. However, it should be recognized that the system may be adjusted to measure capacitance with practically any desired noise levels at practically any desired frequencies. An exemplary embodiment of the present invention can also distinguish between displacement and leakage current. Furthermore, an exemplary embodiment of the present invention can characterize the noise in the system.

The present invention may also take into account how the long-range stray capacitance between the sample and the mm-sized probe assembly varies with the lateral and vertical probe position. It turns out that these variations can be quite large (e.g., greater than about 500 aF in some embodiments), and may be recognized, characterized, and subtracted from the measured capacitance signal in order to quantify small nm-scale lateral variations in the capacitance between the sample and a nm-scale probe tip, for example.

A drawing of a cantilever 10 and tip 12 (e.g., an AFM cantilever and tip) while engaged on the surface is presented in FIG. 1(a). The cantilever 10, tip 12, and sample may have any desired dimensions and characteristics. In this embodiment, the capacitance between the probe and sample includes the capacitance of the nm-scale probe tip 12, the μm-scale cantilever 10, the mm-scale cantilever chip 14, the chip holder, and the associated wiring. The equivalent circuit is shown in FIG. 1(b). The tip-sample capacitance $C_{ts}$ is typically only expected to be about 10–40 aF for a 50–150 nm radius tip. In contrast, the stray capacitance $C_{stray}$ is on the order of ½ pF. Further, there may be a finite resistance $R_{film}$ between the tip and the substrate.

A challenge in SCM is measuring tip-sample capacitances that are on the order of an aF in the presence of stray capacitances that are on the order of ½ pF. It is desired that a detection technique is capable of either measuring capacitance to a part per million or compensating for the effect of the stray capacitances. In addition, the accurate nm-scale analysis of thin dielectric films in some embodiments may require the detection and measurement of any finite resistance at the same time that one measures small variations in $C_{ts}$.

A common means of compensating for the effect of the stray capacitance in SCM is to detect capacitance changes with ultra-high frequency tuned circuits (typically 900 MHz). The RCA tuned circuit of FIG. 2(a) is an example of this class of detector. In this type of circuit, the stray capacitance is included in the tuning elements. Hence, the small changes in capacitance caused by tip-sample capacitance variations change the resonant frequency of the circuit. When the circuit is tuned just off resonance, these small capacitance changes result in large changes in signal amplitude at the output of the circuit. This variation in amplitude is detected with a diode demodulator. Under ideal conditions, this circuit can be sensitive to about $10^{-21} F/\sqrt{Hz}$ changes in capacitance at modulation frequencies above about 10 kHz. However, it has several disadvantages. First, it is difficult to make quantitative capacitance measurements because the sensitivity is altered by any changes in stray capacitance. Second, the noise spectra of tuned circuits are dominated by 1/f noise at frequencies below 4–5 kHz. This makes direct measurements of C difficult. Finally, the tuned circuits cannot detect the existence of resistive contacts; the presence of a resistive contact simply makes the circuit less sensitive. In addition, commercially available SCMs are typically much noisier than the optimized $10^{-21}$ aF/$\sqrt{Hz}$ level. For example, Digital Instruments has reported a noise level of 4–11 aF/$\sqrt{Hz}$ (at 90 kHz) for their SCM sensor.

Bridge circuits have also been used to compensate for the effect of the stray capacitances on SCM measurements made with scanning tunneling microscopy (STM). An example of a bridge circuit is shown in FIG. 2(b). The currents flowing through the two arms of the bridge are equalized by changing the variable capacitor until it matches the stray capacitances. When balanced, there is no voltage difference between the two arms of the bridge. Changes in tip-sample capacitance then alter the current balance and a voltage difference appears across the bridge test points. The sensitivity of typical, commercial bridge circuits used was reported to be about 2 aF.

On the other hand, an exemplary embodiment of a circuit of the present invention is shown in FIG. 3. In this embodiment, phase-sensitive detection is used to measure the current that flows when a fairly low frequency (e.g., about 5 kHz) AC voltage 30 (sinusoidal voltage) is applied between the sample 32 and the tip 34. The left arm of the circuit includes the tip-sample capacitance $C_{ts}$, the stray capacitance $C_{stray}$ and the film resistance $R_{film}$ (see FIG. 1(b)). The right arm includes a "bucking circuit" which is used to add an inverted, constant current that substantially cancels the displacement current flowing through $C_{stray}$. This bucking circuit may be comprised of an optional variable gain amplifier, a variable phase shifter 36 (180° phase shifter), and a coupling capacitor $C_{cc}$ 38. The net current from the two arms of the circuit is measured with a sensitive current amplifier 40 (e.g., an Ithaco current-voltage amplifier). The displacement (capacitive) and dissipative (resistive) components of the current may be measured with a two channel lock-in amplifier 42 (e.g., an SR530 lock-in amplifier) or any other suitable device.

Figure 12:
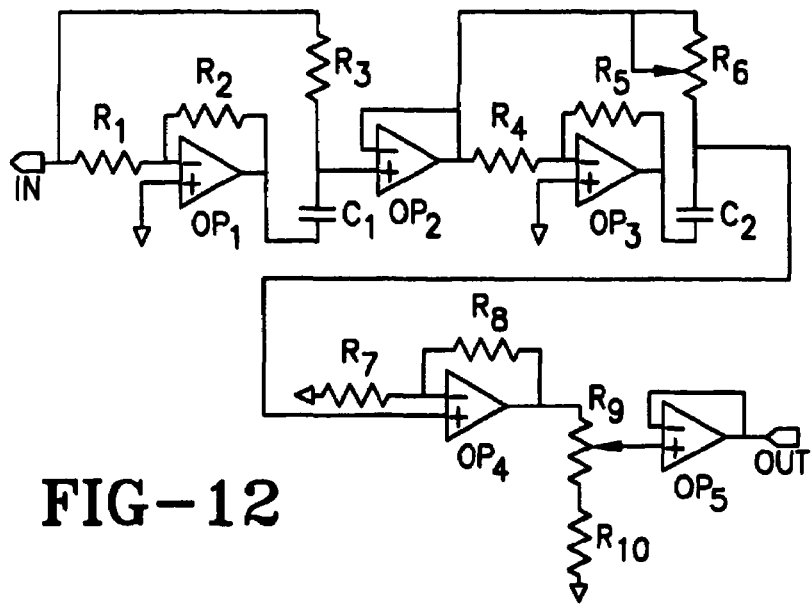
FIG. 12 is an exemplary embodiment of a phase shift circuit comprised of two stages of a phase splitter followed by a resistor and capacitor voltage divider. The output of each stage is buffered by a voltage follower. The phase shift introduced in the first stage is fixed while the phase shift introduced in the second stage is variable. The output buffer of the second stage is a fixed gain noninverting amplifier. The amplitude of the phase-shifted voltage is controlled by using a potentiometer as a voltage divider. This is buffered by a unity gain voltage follower.

An exemplary embodiment of a phase inverting circuit is shown in FIG. 12. In this embodiment, a resistor $R_3$ and capacitor $C_1$ are connected in series. The AC voltage applied to the sample is applied to the resistor and is inverted. The inverted AC voltage is applied to capacitor $C_1$. The output of the divider is phase shifted with respect to the input AC voltage; it is inserted into a unity gain voltage follower that prevents loading of the phase shift network. This is the first stage. The second stage is nearly identical. However, a variable resistor $R_6$ in the network allows the phase to be adjusted, and the buffer amplifier of the second stage has a gain of two in this example. The output of the buffer amp goes to a potentiometer $R_9$ used as a voltage divider in series with a resistor $R_{10}$. This allows independent control of the signal amplitude between about 0.3 and 2 times the input AC voltage. Finally, a voltage follower is used to buffer the phase shift circuit from the external circuitry.

In this particular example of the phase shifting circuit, the inverting and buffer amps in the first and second stage are each ¼ of a LF347 quad op-amp from National Semiconductor. The output buffer is ½ of a LF412 dual op-amp from National Semiconductor. Power to the circuitry may be provided from a homebuilt ±15V supply. The variable resistors $R_6$ and $R_9$ are both wirewound potentiometers. Nevertheless, it should be recognized that the specifications and architecture of the phase shifting circuit may be varied and still provide the desired phase shifting function.

In an exemplary embodiment of the system of the present invention, the variable gain amplifier and variable phase shifting circuit may provide the following benefit. When a sinusoidal drive signal of amplitude $V_0$ and frequency $\omega$ is applied to the sample, a current $I_{afm}$ is driven through the probe-sample junction, and a bucking current $I_{bc}$ is driven through the coupling capacitor $C_{cc}$. The currents are given by $$I_{afm} = j\omega V_o(C_{ts} + C_{stray}) + \frac{V_o}{Rfilm}$$

and $$I_{bc} = -j\omega GV_oC_{cc}$$

where G is the bucking circuit gain. This assumes that the phase of the bucking current is adjusted so that it is 180° out of phase with respect to the signal applied to the sample.

When G is adjusted so that $G=C_{stray}/C_{cc}$, the net current at the input to the current amplifier is given by $$I_{net} = j\omega V_o C_{ts} + \frac{V_o}{Rfilm} \equiv jI_{im} + I_{real}$$

The displacement current through the large stray capacitance may be substantially cancelled by the bucking circuit so the current amplifier may be operated at high gain without being overloaded. The in-phase ($I_{real}$) and out-of-phase ($I_{im}$) parts of $I_{net}$ may be measured independently with a dual-channel lock-in amplifier as the tip is scanned.

From these phase sensitive measurements of the current, the capacitance change, C, and parallel resistance variation, $R_{film}$, may be calculated by rearranging and separating the above equation into its components as follows: $C=I_{im}/(2\pi f V_0)$, and $R=V_0/I_{real}$, where the amplitude of the applied voltage is $V_0$, the displacement current is $I_{im}$, the dissipative current is $I_{real}$, and the frequency of the applied voltage is f. In this exemplary embodiment, the measured capacitance C is offset from the total capacitance by an amount determined by the bucking circuit gain. The current $I_{net}$ in this example was measured with an Ithaco 1212 current amplifier operated at the $10^{-8}$ A/V range setting.

In this example, the AC voltage frequency (5 kHz) and amplitude (3.7 $V_{rms}$) were selected to maximize the signal to noise for our equipment. Nevertheless, it should be recognized that the AC voltage frequency and amplitude may be adjusted to suit a particular application and equipment. Frequency may be limited by the high frequency roll-off of the current amplifier. In most of our measurements, the lock-in amplifier output filter ($\tau=1$ ms) limited the measurement bandwidth to 160 Hz. However, it should again be recognized that these criteria may adjusted to suit a particular application and equipment.

As part of a sensitivity and noise analysis, the noise present in the capacitance measurements were measured with both a test circuit and an AFM probe assembly mounted on a Digital Instruments Dimension 3000 AFM that was connected to the measurement circuitry. While the circuitry was attached to the AFM, noise measurements were made with either: (1) the tip engaged on the surface but not scanning; (2) the tip engaged and scanning; (3) or the tip retracted from the surface by several microns. The test circuit was comprised of a capacitor ($C_{test}$ which was approximately 0.5 pF) connected between the AC voltage source and the current amplifier to simulate the probe-sample capacitance and a second capacitor connected between the bucking circuit and the current amplifier to simulate the coupling capacitor $C_{cc}$. Comparing these noise spectra allows us to differentiate between noise induced by the measurement circuitry, noise that is inherent to the AFM, and noise induced by scanning the AFM tip across a sample. Typical noise spectra are presented in FIGS. 4(a) and 4(b). These spectra were obtained by connecting the capacitive channel analog output of the lock-in amplifier to the input of a Stanford Research Systems SR-770 spectrum analyzer. A series of 20–25 spectra in the frequency range from DC to 195 Hz were obtained and averaged.

Figure 4A:
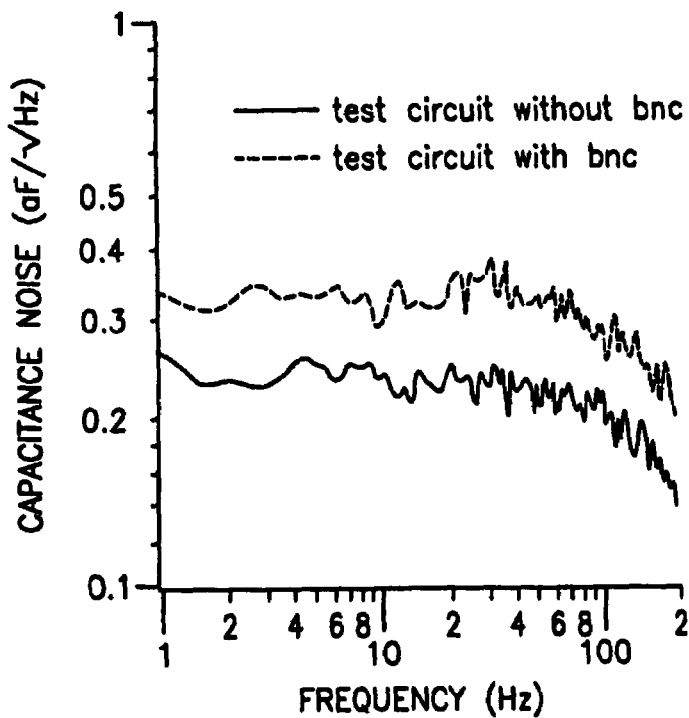
FIG. 4(a) is a noise spectra obtained with an exemplary circuit of the present invention connected directly to a fixed capacitor test circuit (solid line), and with about 30 cm coaxial cable inserted between the capacitor and current amplifier (dashed line).

The spectra presented in FIG. 4(a) were obtained with the test circuit connected to the system. The lower spectrum was measured with the test circuit connected directly to the current amplifier. The spectrum is very flat and the average noise level is about 0.25 aF/$\sqrt{Hz}$ the way down to 1 Hz. The upper spectrum in FIG. 4(a) was measured with an additional 30 cm of coaxial cable between the test circuit and current amplifier. This cable is comparable to the coaxial cable connecting the current amplifier to the AFM tip holder. This extra coaxial cable raises the base noise level to 0.35 aF/$\sqrt{Hz}$ but does not add 1/f noise. While optimal RCA-type circuits can have noise levels as low as $10^{-21}$ aF/$\sqrt{Hz}$ at frequencies above 4–5 kHz, they exhibit significant 1/f noise levels at measurement frequencies closer to 1 Hz. The noise spectra from the resistive channel of the lock-in amplifier (not shown) are also flat down to 1 Hz, with a magnitude of less than 35 fA/$\sqrt{Hz}$. This is comparable to the noise currents in the capacitive channel of the lock-in amplifier. This current noise is mostly due to the noise current from the Ithaco current amplifier which we measured as 30 fA/$\sqrt{Hz}$ at 5 kHz.

Figure 4B:
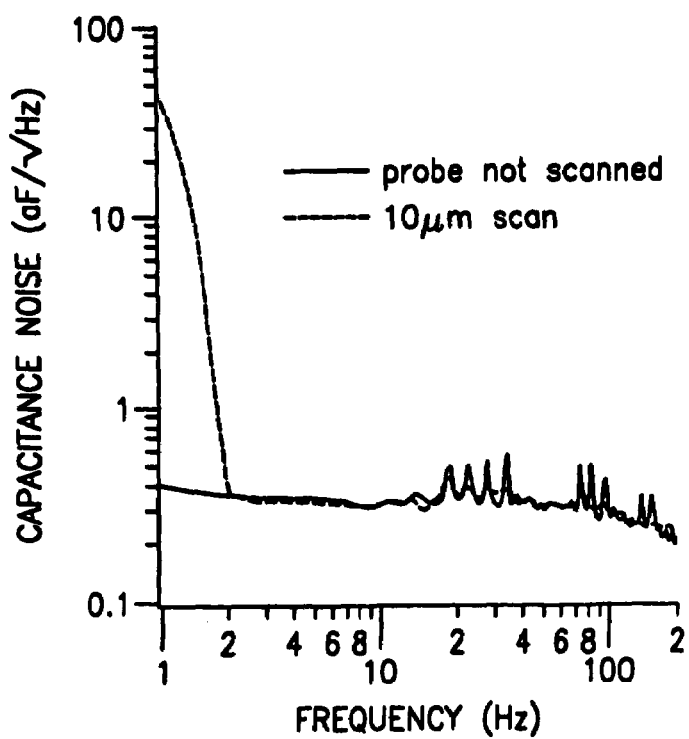
FIG. 4(b) is a noise spectra obtained with an exemplary measurement circuit connected to the tip. The tip was on the sample surface and not scanning (solid line) and on the surface during a 10 μm scan (dashed line). The non-scanning noise spectral density is less than about 0.4 aF/√Hz, which is similar to that measured with the test circuit.

The spectra presented in FIG. 4(b) were obtained with the measurement circuitry connected to an AFM probe. When the tip is not being scanned, the low frequency noise behavior matches that of the test circuit connected to the current amplifier with about a 30 cm length of coaxial cable. In this case, there is little 1/f noise down to 1 Hz and the base noise level is 0.35 aF/$\sqrt{Hz}$. However, these spectra do contain spikes at frequencies from 20 to 200 Hz that are probably caused by electrical or vibrational pick-up in the laboratory. These peaks are not large and add little integrated noise power. The noise level integrated over a 160 Hz bandwidth, measured with the tip not scanning, is 4.1 aF. In comparison, with the test circuit connected with the 30 cm coaxial cable, the noise level integrated over a 160 Hz bandwidth is 4.0 aF. Now, when the tip is scanning over a 10 µm lateral scan (dashed line in FIG. 4b), the spectrum does show significant power at frequencies below 2 Hz. This is caused by position-dependent changes in the measured capacitance which are discussed herein. In this exemplary embodiment, scanning does not add significant noise at frequencies above 2 Hz.

In addition to the noise described above, there is a slow drift in the output of the capacitance measurement circuit. When connected to the test circuit, the drift is about 4 aF/min. We note that a drift rate of 40 $\mu V_{rms}$/min (approximately 1 part in $10^5$ per minute) in the output of the bucking circuit would cause the observed drift. While connected to an AFM tip in contact with a sample, the drift rate increases to 6–9 aF/min. Note that this drift does not add observable noise to the measured spectrum above a frequency of 1 Hz.

In summary, our exemplary measurement circuitry exhibits about 0.35 aF/$\sqrt{Hz}$ of noise from 1 to 160 Hz, with an integrated noise level of less than about 5 aF over this bandwidth. This noise is mostly due to current noise from the current amplifier. This suggests that using a low noise, higher frequency current amplifier and a higher frequency sinusoidal AC voltage could increase sensitivity further still.

As previously discussed, a need exists to measure small variations in the nm-scale capacitance $C_{ts}$ associated with the nm-scale probe-tip and the local sample region. However, this measurement may be taken in the presence of a large (e.g., about 0.5 pF) stray capacitance $C_{stray}$ that is due to long-range capacitive coupling between the sample and the µm-scale cantilever and mm-scale cantilever support structure. The inventors have found that this long range $C_{stray}$ itself exhibits significant variations as the probe is scanned over a sample. Hence, in order to monitor and quantify nm-scale variations in $C_{ts}$, it may be useful and desirable to characterize and understand how $C_{stray}$ varies with tip position.

Figure 5A:
FIG. 5(a) is a topography image of a 104-nm trench etched into an exemplary sample of $SiO_2$ on Si and covered with 10 nm Of $Si_3N_4$.
Figure 5B:
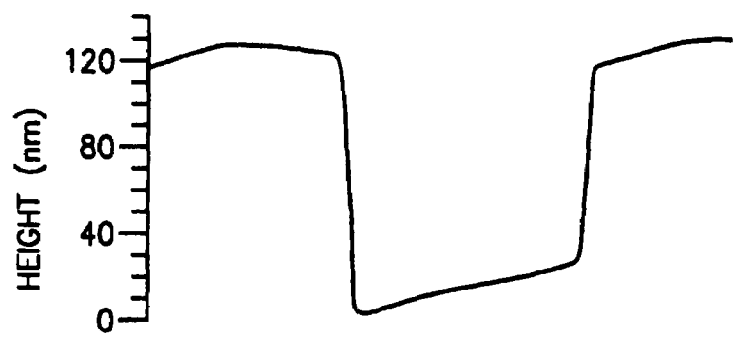
FIG. 5(b) is a cross section of the topography along the dashed line in FIG. 5(a).
Figure 5C:
FIG. 5(c) is a simultaneously acquired capacitance image of the trench described with regard to FIG. 5(a).
Figure 5D:
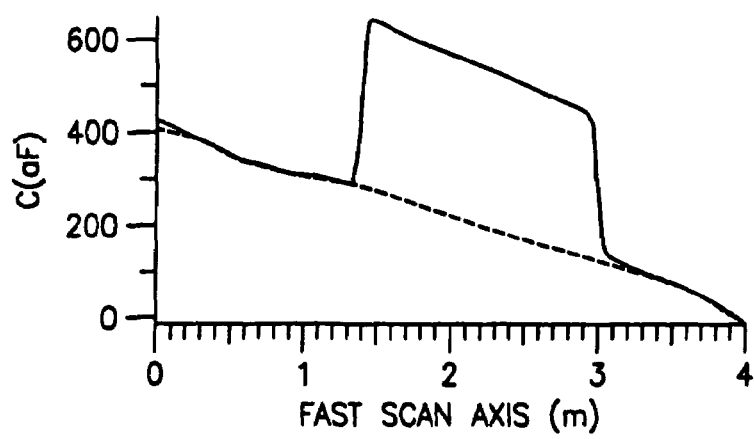
FIG. 5(d) is a capacitance cross section along the dashed line in FIG. 5(c).

This is illustrated in FIGS. 5(a) through 5(d), which show simultaneously acquired topography and capacitance data obtained while scanning across a "trench". The exemplary sample (calibration grating TGZ02 supplied by MikroMasch) is a grating of trenches etched in $SiO_2$ on Si and coated with 10 nm of $Si_3N_4$. Each trench is specified as 104±1.5 nm deep and 3 µm wide. FIGS. 5(a) and 5(c) are grey-scale images of the topography and capacitance, respectively. FIGS. 5(b) and 5(d) are cross sections along the dashed lines in FIGS. 5(a) and (c). There are two interesting features in the capacitance cross section. First, the SCM cross section is varying in the flat regions away from the step. This variation is nearly linear with a slope of about 100 aF/µm (FIG. 5(d) dashed line). One may naively expect that the nm-scale tip-sample capacitance $C_{ts}$ should be essentially constant in these flat, uniform regions. Second, there is a large change in capacitance (e.g., about 350 aF in this example) when the probe crosses the edge of a trench. From models of the tip-sample capacitance, one may expect that $C_{ts}$ variations should only be about 10s of aF when the probe is scanned across this trench boundary.

Surprisingly, the inventors have found that these variations in measured capacitance are due to variations in the long-range capacitance $C_{stray}$. $C_{stray}$ may vary with tip position in two principle ways. First, $C_{stray}$ varies systematically with lateral tip position, even when scanning a uniform sample that has no intrinsic variations in dielectric film thickness or morphology. These lateral variations can range from about 1 to about 100 aF/µm of lateral scanning. The largest variations may occur when the long axis of the cantilever is parallel to the fast scan direction while smaller variations may occur when the long axis of the cantilever is perpendicular to the fast scan direction. These lateral variations are attributed to changes in the "tilt" of the probe assembly with respect to the sample that are caused by the bending of the piezoelectric scanner tube. Second, $C_{stray}$ varies with the average height h of the probe assembly above the sample surface. Typical capacitance variations with height may be about 2–4 aF/nm, depending on cantilever size and shape. This is simply due to the change in separation between the sample and the probe assembly. As a result, these two factors can explain the anomalous features in the capacitance trace shown in FIG. 5(d).

Figure 6A:
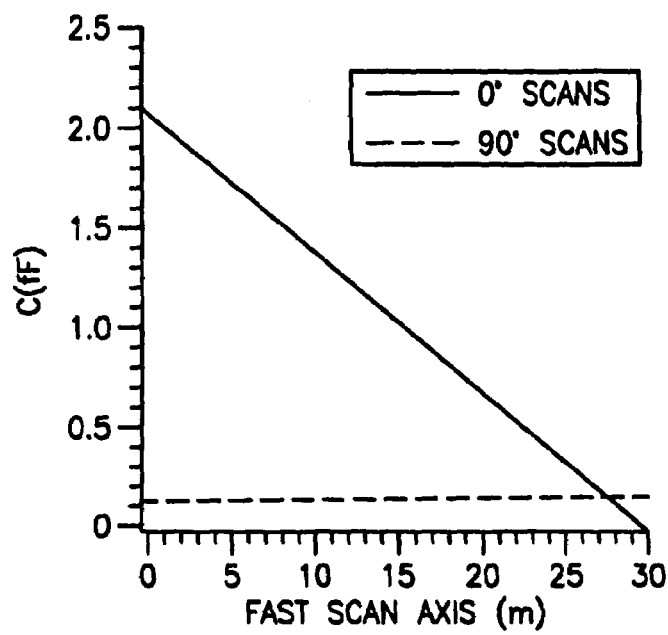
FIG. 6(a) is a graph of 30 μm long line scans on an exemplary sample of flat, uniform 10 nm thick $SiO_2$ film grown on Si, with fast scan direction parallel to [0° (solid line)] and perpendicular to [90° (dashed line)] the cantilever long axis.

To characterize variations in $C_{stray}$ with lateral position, an exemplary sample of a flat, uniform, 10 nm thick, thermal $SiO_2$ film grown on highly doped Si was scanned. On such a uniform sample, one would not expect any variations in the nm-scale capacitance $C_{ts}$. In fact, we observed a nearly linear variation, across the sample, in the total capacitance $C_{ts} + C_{stray}$. FIG. 6(a) is a graph of two single scan lines to illustrate this effect. When the long axis of the cantilever is parallel to the fast scan direction (which we call a "0° scan," solid line), the slope of the capacitance line is greatest. In contrast, when the long axis of the cantilever is perpendicular to the fast scan direction (a "90° scan," dashed line), the slope of the capacitance line is much smaller.

Figure 6B:
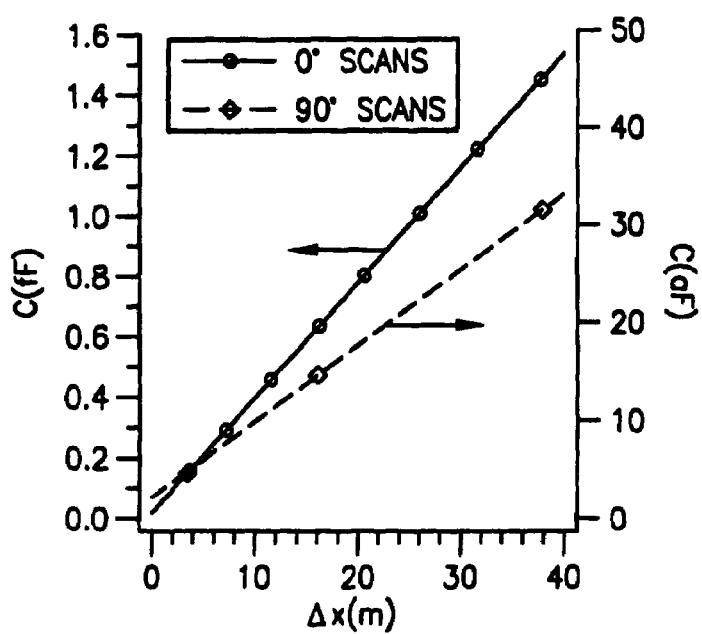
FIG. 6(b) is a graph of capacitance change versus scan length for 0° (solid line) and 90° (dashed line) scans.

The inventors discovered that the slope of the linear variation in $C_{stray}$ is nearly independent of scan size and scan velocity. FIG. 6(b) is an illustration of how the total change in capacitance ΔC depends on the scan size Δx. It is shown that ΔC increases substantially linearly with scan size, suggesting that this variation is a geometrical effect and not caused by time-dependent effects such as piezoelectric "creep."

Figure 7A:
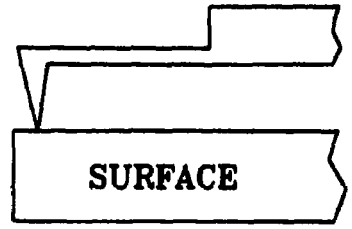
FIG. 7 is a schematic that illustrates how the bending of the piezoelectric scanner tube during a exemplary scanning process changes the tilt between the cantilever and the sample surface. (a)—For a 0° scan, the cantilever is extended toward the probe tip, and the cantilever becomes more parallel to the surface. This reduces the average separation between the cantilever and the surface and increases the capacitance. (b)—The cantilever is retracted away from the probe tip, causing an increase in the average separation and a decrease in the capacitance. (c) and (d)—For a 90° scan, there is a much smaller change in average separation and stray capacitance.
Figure 7B:
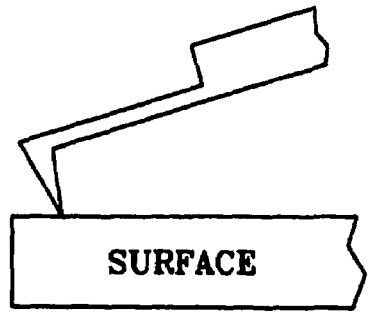

This variation in $C_{stray}$ with lateral position is attributed to changes in the "tilt" of the probe assembly as it is scanned across the surface. This effect is illustrated in FIG. 7. First, consider the 0° scan case. The cantilever is moved laterally by a bending of the piezoelectric scanner tube. When the probe assembly is displaced towards the probe-tip end of the cantilever, the cantilever assembly becomes more parallel to the sample. This reduces the average separation between the probe assembly and the sample, hence increasing the stray capacitance as demonstrated in FIG. 7(a). Conversely, when the probe assembly is displaced away from the probe-tip, the cantilever assembly becomes less parallel to the sample and a resulting increase in average separation and decrease in stray capacitance occurs as shown in FIG. 7(b). Accordingly, the inventors have confirmed that the capacitance does increase when the probe is extended toward the probe-tip end of the cantilever.

Figure 7C:
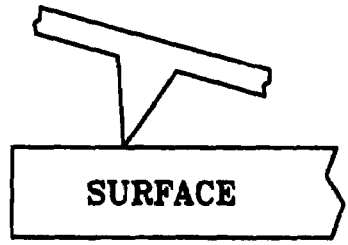
Figure 7D:
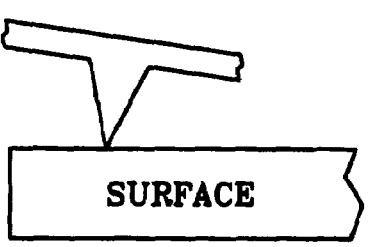

Next, consider the 90° scan case where the cantilever is not precisely parallel to the surface (see FIGS. 7(c) and (d)). As the probe is scanned to the right, the left half of the probe gets closer to the sample while the right half retracts. The variation in average separation is much smaller than the variation during a 0° scan and hence, the capacitance variation is much smaller in this example. In fact, the observed variation in capacitance during 90° scans may well be caused by misalignment of the long axis of the cantilever to the fast scan direction. This would add a contribution from the 0° scan component to the capacitance variation.

Figure 8A:
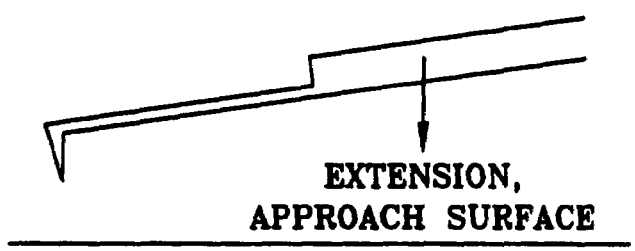
FIG. 8 is a schematic of an exemplary embodiment of a cantilever chip, cantilever, and probe tip during a force calibration curve. (a)—Cantilever is undeflected cantilever with the tip out of contact during approach. (b)—Cantilever beam deflects downward as attractive/adhesive forces pull the probe-tip onto the surface. (c)—Cantilever beam deflects upward as repulsive forces between the tip and sample are caused by further extension of the z-piezoelectric tube.
Figure 8B:
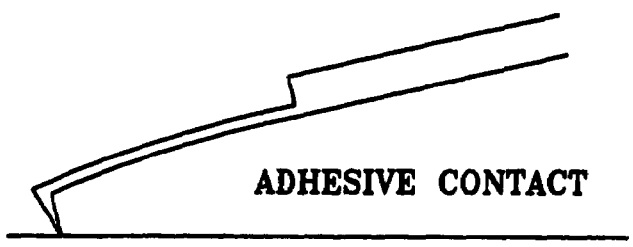
Figure 8C:
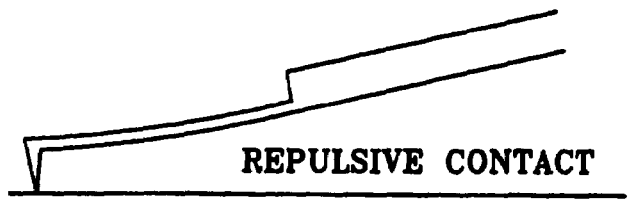

The other change in stray capacitance that was observed during scanning was a change in capacitance as the cantilever-holder height above a sample was varied. The inventors examined this effect by recording capacitance as force calibration curves were acquired. In these experiments, as shown in FIG. 8(a), the probe is positioned well above the surface and the piezo is extended so that the tip approaches the surface. At a critical distance, attractive forces between the tip and surface cause the cantilever to deflect toward the surface and the tip makes contact with the surface (FIG. 8(b)). As the piezo continues to extend, the tip-surface interaction becomes repulsive and the cantilever now deflects upward (FIG. 8(c)). Next, the piezo reverses direction and retracts the cantilever from the surface. During retraction, adhesive forces keep the tip in contact with the surface, and the cantilever bends downward for some time. Next, the tip snaps free of the surface, the cantilever returns to its undeflected position, and the retracting piezo continues to increase the tip height. An average of 25 deflection and capacitance versus piezo position curves, during both extension and retraction, are presented in FIG. 9. The exemplary sample was a 10 nm thick, thermal $SiO_2$ film grown on heavily doped (e.g., $10^{20}/cm^3$) n-type Si.

Figure 9A:
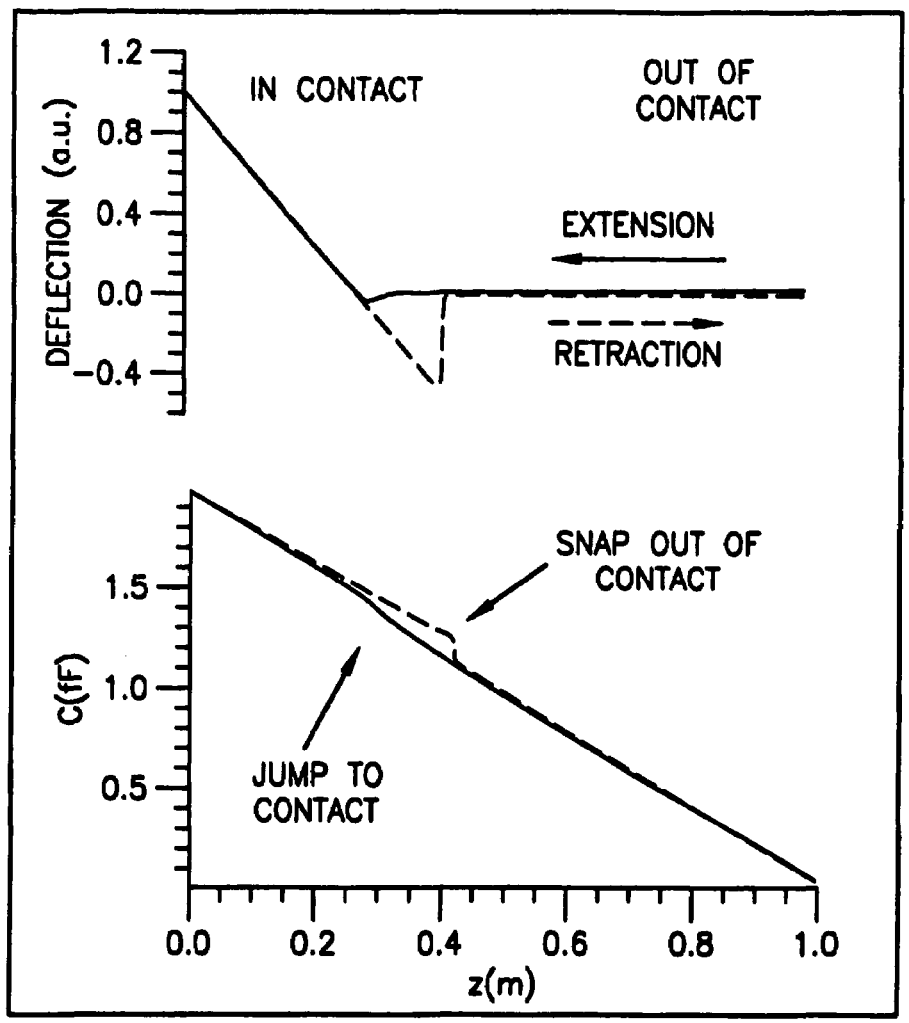
FIG. 9(a) is a graph of force calibration curves and corresponding variations in ΔC as a tip approaches and retracts from an exemplary embodiment of a sample surface. The slope of ΔC versus z curve decreases when the tip is in contact. This is due to the separation of the cantilever from the surface being fixed at the probe-tip end. Also note the sudden increase (decrease) in ΔC that occurs when the tip jumps to (snaps out of) contact.
Figure 9B:
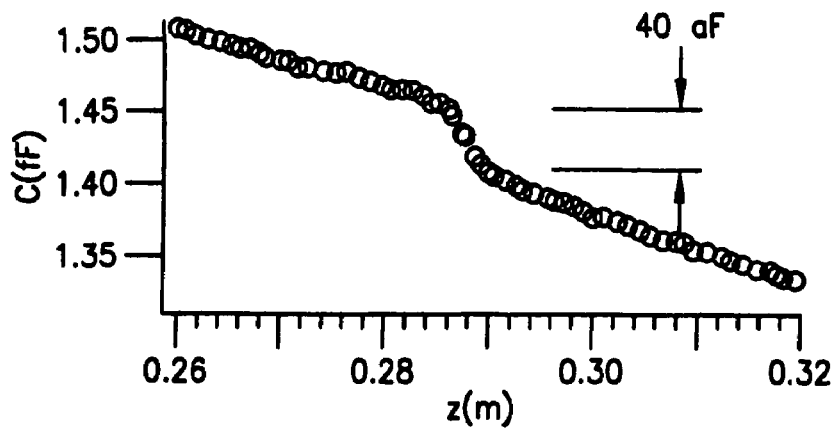
FIG. 9(b) is an enlarged view of the increase in ΔC that occurs when the tip jumps to contact.

As the probe assembly approaches the surface (FIG. 9(a)), the measured capacitance increases in a substantially linear fashion. However, as the tip nears the surface, the slope of the capacitance curve, dC/dz, increases slightly. If a parallel plate capacitor is used as a crude model of the probe assembly-sample geometry, we expect C to be approximately equal to A/z, where A is the effective plate area and z is the effective plate separation. In this case, the slope of the capacitance-height curve should vary as $A/z^2$. Hence, we expect the slope dC/dz to increase slightly as the tip approaches the surface. As approach continues, at the point the tip jumps into contact with the surface, there is an abrupt jump in capacitance. An expanded scale view of the snap-on region of the capacitance-height curve is shown in FIG. 9(b). Note that it shows the change in capacitance caused when the tip jumps into contact with the surface. The capacitance jump does not appear abrupt because the measurement time constant of the lock-in is longer than the sampling period. Finally, as the tip enters repulsive contact, the slope of the capacitance-height curve decreases. This is because the height of the tip end of the cantilever is now fixed, so the average height of the cantilever and holder decreases more slowly as the z-piezo is extended.

During retraction, the capacitance changes are reversed. As the piezo pulls the cantilever, adhesive forces maintain contact with the surface, the cantilever deflects, and the capacitance decreases in a nearly linear fashion. When the force due to the bending cantilever exceeds the adhesive force, the tip snaps free of the surface and the capacitance decreases suddenly. This is caused by the sudden change in average cantilever height when the cantilever returns to its undeflected position. Finally, as the cantilever retracts away from the surface, the capacitance decreases in a nearly linear fashion.

For example, the typical value measured for the slope of the capacitance-height curve, with the tip out of contact with the surface, is about 2 aF/nm for the MESP probes and about 3.5 aF/nm for the CSC11/TiN probes. The CSC11/TiN cantilevers should have a larger dC/dz than the MESP cantilevers because they are composed of two beams that form a triangle while the MESP cantilevers are composed of a single beam. This results in a larger effective area A for the CSC11/TiN cantilevers. The standard deviation of the measured slopes is approximately 10% in this example. Likely causes of this variation include varying tip-sample interactions caused by adsorbed contaminants such as water, changing piezoelectric scanner tube response to applied voltage, and changes in the geometry of the probe assembly.

In view of these findings, it is now possible to understand the anomalous capacitance data measured while scanning across a trench in Si as presented in FIG. 5. The observed slope in capacitance versus lateral position is mostly due to the probe-assembly tilt effect described above. In this example, the anomalous, large increase in capacitance as the tip moves down into the trench may deserve consideration of the following factors. First, an upper limit estimate of the tip-sample capacitance may be obtained by approximating the tip-sample capacitance as a parallel plate capacitor with an area given by $\pi r^2_{tip}$, where $r_{tip}$ is the tip radius. For $r_{tip}$ of about 50 nm in this example, the change in capacitance caused by the 100 nm change in $SiO_2$ film thickness encountered while scanning across the trench would only be about 25 aF. In contrast, the measured change is about 350 aF, or 15 times too large. Clearly, the film thickness variations cannot be responsible for the measured capacitance. Next, consider the change in probe assembly-sample geometry as the tip is scanned across the trench. In "constant force mode" AFM, the entire probe assembly is extended as the tip is scanned into the trench. During this extension, the cantilever deflection is kept nearly constant. This means that the average separation h between the sample and, relatively large, probe assembly decreases by roughly the size of the step. This effect is shown schematically in FIG. 10 where a cross-section of a tip on a cantilever is shown during a 90° scan down into a trench. This decrease in average separation h causes the increase in capacitance shown in FIG. 5.

In FIG. 11, it is shown that the height sensitivity of the capacitance can be used to account for the variation in capacitance measured when scanning across the trench. This data was obtained with a 90° scan angle on the same trenched sample as the 0° scan data shown in FIG. 5. Line (a) in FIG. 11 is the topography trace after "flattening" the image by subtracting a linear least squares fit to the upper terraces of the trench. The dots (b) in FIG. 11 show the corresponding capacitance trace. It too has been flattened to remove the slope introduced by the lateral position dependent change in capacitance discussed above. Finally, we estimate the change in capacitance $\Delta C(x)$ caused by the change in the average probe-assembly height as $\Delta C(x)=(dC/dz)_0 z(x)$. Here, $(dC/dz)_0$ (e.g., about 3.6 aF/nm in this example) is the measured slope of the capacitance-height curve, evaluated where the tip is just out of contact, and $z(x)$ is the measured topography. This estimate of $\Delta C(x)$ is shown as the dashed line (c) in FIG. 11. It has essentially the same shape and magnitude as the measured $\Delta C(x)$ but, in this example, over-estimates the measured $\Delta C(x)$ by about 10%. This may be due to an approximate 10% error in the determination of $(dC/dz)_0$. This procedure a number of times, across deep (e.g., about 100 nm) trenches on multiple samples and in general find that the calculated $\Delta C(x)$ agrees with the measured $\Delta C(x)$ within about 10%.

In one exemplary embodiment for correcting measured SCM data for lateral variations in the long-range stray capacitance, the following steps may be performed:

(1) Measure capacitance $C_{raw}$ vs. probe height z as the probe assembly is moved at a substantially constant velocity toward the surface [e.g., as shown in FIG. 9(b)]. From this determine the slope of the curve when the tip is out of contact with the sample (i.e., before the tip snaps into contact with the sample). Call this quantity: $dC/dz|_{out}$ of contact (2) Then scan a fairly large (e.g., several μm) area of sample with the tip in contact to simultaneously measure topography data [i.e., $z(x, y)$], and capacitance data $[C_{raw}(x,y)]$.

(3) Flatten the topography data in a suitable way (e.g., as done by conventional AFM analysis software for AFM imaging) to remove any average slope to the topography data. This provides $z(x,y)$. However, if there is only one scan line provided (e.g., only scanning in the x or y direction), then the function would be $z(x)$ or $z(y)$.

(4) Calculate the change $\delta C_{corr}(x,y)$ in long-range parasitic capacitance caused by the changes in average tip using: $\delta C_{corr}(x,y)=-z(x,y)(dC/dz|_{out\ of\ contact})$ (5) Subtract $\delta C_{corr}(x,y)$ from $C_{raw}(x,y)$ to give the corrected data.

(6) Flattening this corrected data by removing its average slope (e.g., as was done in step (3) for the topography data). This substantially removes any change in the long-range stray capacitance caused by a tilting of the probe assembly during scanning. It also substantially removes an (artificial) average slope that might be introduced if the topography data was not sufficiently flattened in step (3). It should be recognized that the raw capacitance may be flattened either before or after $\delta C_{corr}(x,y)$ is subtracted. This step results in the actual lateral variations in the short-range (nm-scale) capacitance relative to some (e.g., arbitrary) reference value.

In the process of making capacitance measurements, the inventors discovered that scanning induced variations in parasitic capacitance may be large but reproducible and mostly predictable. The inventors found that about 90% of the topography induced variations in parasitic capacitance may be accounted for when making capacitance measurements, as discussed above. Hence, the range of sample topographical variations can be estimated that would produce unaccounted topographical capacitance variations that are below the approximate 5 aF noise level of an exemplary system of the present invention. It should, however, be recognized that the desired noise level may be higher or lower for other implementations of the system of the present invention. For this exemplary embodiment, the unaccounted topographical capacitance variations can be estimated as 10% of the calculated topographical variation. A maximum unaccounted capacitance variation of 5 aF can then be assumed, and δz can be solved as:

$$\delta z = 5 \text{ aF}/(0.1 \ (dC/dz)_0)$$

With typical $(dC/dz)_0$ values between about 2–4 aF/nm, topographical variations of less than 12 to 25 nm would produce unaccounted capacitance variations smaller than the 5 aF noise level in this embodiment. Hence, on sample surfaces with roughness of less than 12–24 nm, the tip-sample capacitance changes down to the 0.35 aF/√Hz noise level of an exemplary system can be measured after accounting for parasitic capacitances.

The present invention also includes a method to extract just the nanometer-scale part $C_{ts}$ of the measured probe-sample capacitance. For some applications, it may be desirable to determine the magnitude of just this nm-scale part in order to interpret local nm-scale variations in capacitance in terms of local sample properties. For example, if one wants to use capacitance to measure the local (nm-scale) film thickness, it may be necessary to know how much of the total measured capacitance is due to the local area just under the contact-part of the tip.

Figure 13A:
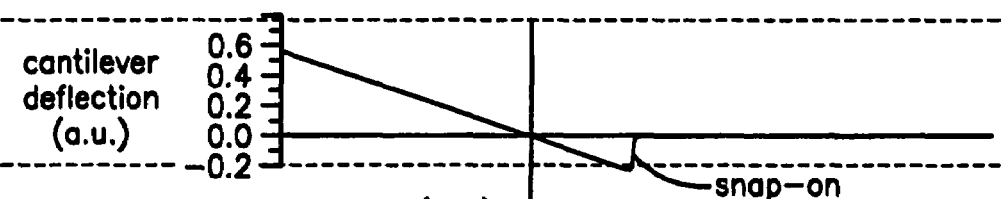
FIG. 13(a) is a plot of an exemplary cantilever deflection measured during approach. Note the sudden snap into contact and the subsequent height z where the deflection is zero while in contact with the surface (vertical dashed line).

The present inventors have discovered a system and method for determining the nm-scale tip-sample capacitance $C_{ts}$ by simultaneously measuring the AFM cantilever deflection and the probe-sample capacitance as a function of probe-assembly height z. Measuring cantilever deflection as a function of probe-assembly height z is a conventional AFM measurement known as a "force-calibration curves". The present inventors have extended this measurement to include measurement of the change in the probe-sample capacitance [relative to some reference level—this enables the measurement of changes in the probe-sample capacitance (relative to the particular reference level) with aF precision]. An example of such an extended force calibration curve, which is an average of 10 scans, is presented in FIG. 13. The sudden negative cantilever deflection pointed to by arrow in FIG. 13(a) is the result of electrostatic and meniscus formation forces causing the cantilever to deflect downward (negative deflection) and the tip to snap onto the surface. As the probe-assembly is extended further towards the surface, the cantilever deflection becomes less negative, passes through 0 at the z value shown by the vertical dashed line, and then becomes positive (upward deflection). This occurs because the tip-end of the cantilever is held at fixed height by the surface as the rest of the probe assembly continues to move down.

Figure 13B:
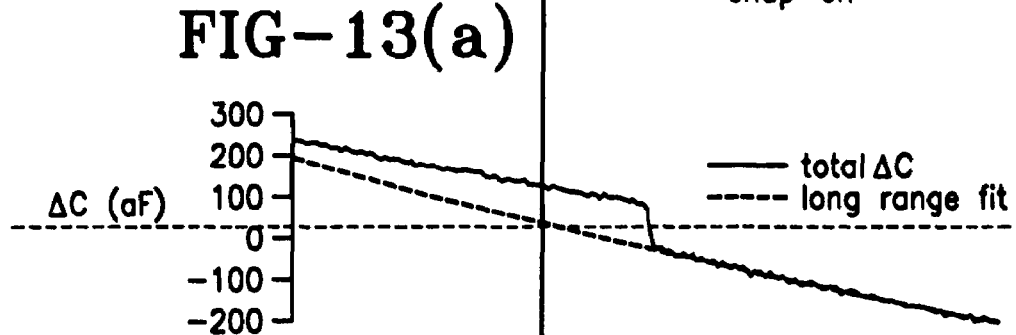
FIG. 13(b) is a graph of the simultaneously measured capacitance change that occurs during extension of an exemplary embodiment of the present invention. The extrapolated long-range capacitance change caused by the cantilever and probe assembly is subtracted from the capacitance data to obtain the residual capacitance shown in FIG. 13(c).

The simultaneously acquired capacitance data is presented in FIG. 13(b). As the tip-cantilever-probe assembly approaches the surface, the long-range capacitance increases monotonically. This is mostly due to the long-range capacitance of the entire AFM probe assembly (i.e., cantilever, holder, wires) as it approaches the surface. The contribution of this long range capacitance may be removed from the data by subtracting a quadratic polynomial fit to the out-of-contact, long-range capacitance (e.g., FIG. 13(b)). However, it is important to note that this long-range capacitance removal may only be accurate when the cantilever is undeflected if the data for the long-range quadratic fit is measured with an undeflected cantilever. However, it should be recognized that a linear fit may be sufficient, or even preferred, instead of a quadratic fit to the long-range, out-of-contact data in other embodiments of the present invention.

Figure 13C:
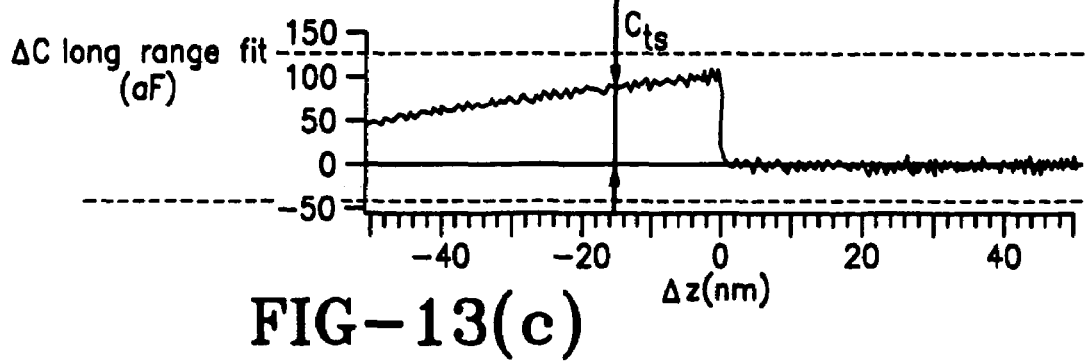
FIG. 13(c) is a graph of residual capacitance during extension of an exemplary embodiment of the present invention. Note the sudden increase of capacitance that occurs at snap-on. The nm-scale capacitance $C_{ts}$ is substantially equal to the residual capacitance at the height (while in contact) where the cantilever deflection is zero.

In FIG. 13(c), an abrupt increase is shown in the residual capacitance when the tip snaps onto the surface. This abrupt increase may be comprised of two parts: (1) an increase in the short range, nm-scale capacitance $C_{ts}$, and (2) a change in the long-range capacitance associated with a deflection of the cantilever. If the residual capacitance is measured at the height where the deflection is zero (shown by the dashed line and the two arrows in the figure), then the contribution due to cantilever deflection should be about 0. Hence, the increase in just the nm-scale part of the capacitance may be determined by evaluating the residual capacitance (as defined above) at the probe height where the cantilever deflection is zero.

In summary, an exemplary method of the present invention for measuring nm-scale capacitance may include the following steps:

(1) Measure cantilever deflection and the change in probe-sample capacitance (relative to some reference level) during a Force Calibration Curve (i.e., as a function of the probe assembly height z).

(2) Fit the out-of-contact data to a smoothly-varying function. A quadratic fit was used in the above example, but a linear fit could also be used.

(3) Subtract this smooth function from capacitance data to get "residual capacitance" as a function of z.

(4) Evaluate residual capacitance at z-position where cantilever deflection is zero. This is the magnitude of the "nm-scale" capacitance $C_{ts}$.

As noted throughout, the exemplary system specifications provided herein may be varied to suit a particular application. Based on the teaching of the present invention, one of ordinary skill in the art may adjust the system specifications in order to satisfy the requirements of a particular application. For instance, the scanning rate and direction, the system noise level, the probe dimensions, the system detection frequency, as well as other system specifications as provided herein may be adjusted to suit a particular application and equipment.

The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to affect the described invention. Many of those variations and modifications will provide the same result and fall within the spirit of the claimed invention. It is the intention, therefore, to limit the invention only as indicated by the scope of the claims.

What is claimed is:

1. A method for measuring nm-scale tip-sample capacitance, said method comprising:
   measuring a cantilever deflection and a change in probe-sample capacitance relative to a reference level as a function of a probe assembly height;
   fitting out-of-contact data to a function;
   subtracting said function from capacitance data to get a residual capacitance as a function of said probe assembly height; and
   determining said nm-scale tip-sample capacitance by equating said residual capacitance at a z-position where said cantilever deflection is zero.

2. The method according to claim 1 wherein said function is a smoothly-varying function.

3. The method according to claim 1 wherein said fitting of said out-of-contact data to a function is accomplished using a quadratic fit.

4. The method according to claim 1 where said fitting of said out-of-contact data to a function is accomplished using a linear fit.

* * * * *